(12) United States Patent
Zhang (10) Patent No.: US 11,307,769 B2
(45) Date of Patent: Apr. 19, 2022

(54) DATA STORAGE METHOD, APPARATUS AND STORAGE MEDIUM

(71) Applicant: BEIJING BAIDU NETCOM SCIENCE TECHNOLOGY CO., LTD., Beijing (CN)

(72) Inventor: Jian Zhang, Beijing (CN)

(73) Assignee: BEIJING BAIDU NETCOM SCIENCE TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/354,067

(22) Filed: Mar. 14, 2019

(65) Prior Publication Data

US 2019/0361609 A1 Nov. 28, 2019

(30) Foreign Application Priority Data

May 24, 2018 (CN) .......................... 201810509933.1

(51) Int. Cl.
*G06F 3/06* (2006.01)
*G06F 12/122* (2016.01)
(Continued)

(52) U.S. Cl.
CPC ............ *G06F 3/0608* (2013.01); *G06F 3/061* (2013.01); *G06F 3/0647* (2013.01);
(Continued)

(58) Field of Classification Search
CPC ...... G06F 3/06; G06F 12/12; G06F 2212/401; G06F 3/0608; G06F 3/061; G06F 3/0647; G06F 3/0683; G06F 12/122; G06F 12/123
(Continued)

(56) References Cited

U.S. PATENT DOCUMENTS 8,171,207 B2 * 5/2012 Chang ................. G06F 12/0246
711/103
8,171,216 B2 * 5/2012 Dawkins ............... G06F 3/0685
711/114
(Continued)

FOREIGN PATENT DOCUMENTS

CN 101201801 A 6/2008
CN 101414244 A 4/2009
(Continued)

OTHER PUBLICATIONS

The Chinese First Examination Report of corresponding Chinese application No. 201810509933.1, dated Jun. 26, 2019.

*Primary Examiner* — Christopher B Shin
(74) *Attorney, Agent, or Firm* — J.C. Patents (57) ABSTRACT

The present disclosure provides a data storage method, an apparatus, and a storage medium, the method comprising: receiving a data storage request from a client, wherein the data storage request comprises data to be stored; determining a state of the data to be stored according to a least frequently used (LFU) and a least recently used (LRU) of the data to be stored, wherein the state is a cold data state or a hot data state; and determining a corresponding storage medium for the data to be stored according to the state of the data to be stored, and storing the data to be stored in the storage medium. The data storage method, the apparatus, and the storage medium provided in the present disclosure allow for reducing the probability of reading a disk and improving the stability of a system.

11 Claims, 5 Drawing Sheets

(51) Int. Cl.
*G06F 12/123* (2016.01)
*H03M 7/30* (2006.01)

(52) U.S. Cl.
CPC .......... *G06F 3/0683* (2013.01); *G06F 12/122* (2013.01); *G06F 12/123* (2013.01); *H03M 7/30* (2013.01); *G06F 2212/401* (2013.01)

(58) Field of Classification Search
USPC ........................................................ 711/160
See application file for complete search history.

(56) References Cited

U.S. PATENT DOCUMENTS

| | | | | |
|---|---|---|---|---|
| 8,447,948 | B1* | 5/2013 | Erdogan | G06F 12/0871 |
| | | | | 711/129 |
| 9,472,248 | B2* | 10/2016 | Wilkerson | G11C 7/1072 |
| 9,727,479 | B1 | 8/2017 | Armangau et al. | |
| 9,846,711 | B2* | 12/2017 | Borthakur | G06F 16/22 |
| 9,892,054 | B2* | 2/2018 | Shiu | G06F 3/061 |
| 10,102,150 | B1* | 10/2018 | Visvanathan | G06F 12/128 |
| 10,176,103 | B1* | 1/2019 | Chatterjee | G06F 11/1076 |
| 10,275,170 | B2* | 4/2019 | Ravimohan | G11C 11/5628 |
| 10,387,243 | B2* | 8/2019 | Liu | G06F 3/0608 |
| 10,402,102 | B2* | 9/2019 | Oh | G06F 12/0246 |
| 10,489,073 | B2* | 11/2019 | Kondapalli | G06F 3/0631 |
| 10,521,143 | B2* | 12/2019 | Subramanian | G06F 3/0653 |
| 10,521,353 | B2* | 12/2019 | Lim | G11C 29/021 |
| 10,795,586 | B2* | 10/2020 | Li | G06F 3/0616 |
| 10,871,914 | B2* | 12/2020 | Lin | G06F 3/0604 |
| 2003/0229761 | A1* | 12/2003 | Basu | G06F 12/0866 |
| | | | | 711/134 |
| 2009/0327621 | A1* | 12/2009 | Kliot | G06F 12/0253 |
| | | | | 711/154 |
| 2016/0170659 | A1* | 6/2016 | Golander | G06F 16/18 |
| | | | | 711/158 |
| 2017/0039000 | A1* | 2/2017 | Feng | G06F 3/0683 |
| 2017/0228322 | A1* | 8/2017 | Chang | G06F 3/0647 |
| 2018/0046381 | A1* | 2/2018 | Fagiano | G06F 3/0608 |
| 2019/0179763 | A1* | 6/2019 | Lo | G06F 12/023 |

FOREIGN PATENT DOCUMENTS

| | | |
|---|---|---|
| CN | 101692229 A | 4/2010 |
| CN | 103106153 A | 5/2013 |
| CN | 107766258 A | 3/2018 |
| CN | 107908367 A | 4/2018 |

* cited by examiner

DATA STORAGE METHOD, APPARATUS AND STORAGE MEDIUM

CROSS-REFERENCE TO RELATED APPLICATIONS

This application claims priority to Chinese Patent Application No. 201810509933.1, filed on May 24, 2018, which is hereby incorporated by reference in its entirety.

TECHNICAL FIELD

The present disclosure relates to data storage technologies, and in particular, to a data storage method, an apparatus, and a storage medium.

BACKGROUND

With the rapid development of the Internet, the amount of data is exploding, raising the challenge facing the back-end storage plane that bears service data, especially the key and value (KV) cache system that supports high-throughput traffic. In the scenario of massive data storage, the cost of memory has bloated substantially. In order to solve the storage cost problem for the KV cache system, it may often adopt a KV cache system which stores by combining a memory with a disk.

In the prior art, register to memory (R2M) is a common technique for storing data by combining a memory with a disk. The R2M identifies a state of a data as hot data state by using a popularity statistics algorithm based on the LFU (least frequently used) of a key's value (key). The hot data will be stored in a memory, while cold data, i.e., data with no or infrequent access, will be stored in a hard disk.

However, in the R2M, includes a criteria to assess the data state is relatively superficial, leading to inaccuracy in deciding the cold data state and the hot data state, which in turn cause the probability of the system to read the disk increased, resulting in poor system stability.

SUMMARY

To solve the problems in the prior art, the present disclosure provides a data storage method, an apparatus, and a storage medium to reduce the probability of reading a disk and improve the stability of a system.

In a first aspect, an embodiment of the present disclosure provides a data storage method, including:

receiving a data storage request from a client, where the data storage request includes data to be stored;

determining a state of the data to be stored according to a least frequently used (LFU) and a least recently used (LRU) of the data to be stored, where the state of the data to be stored is a cold data state or a hot data state; and determining a corresponding storage medium for the data to be stored according to the state of the data to be stored, and storing the data to be stored in the corresponding storage medium determined for the data to be stored.

Optionally, the determining the state of the data to be stored according to the LFU and the LRU of the data to be stored includes:

when the LFU of the data to be stored is greater than a first preset threshold and the LRU is greater than a second preset threshold, determining the state of the data to be stored as the hot data state; otherwise, determining the state of the data to be stored as the cold data state.

Optionally, following the determining a state of the data to be stored according to the LFU and the LRU of the data to be stored, the method further includes:

updating the state of the data to be stored according to length information of the data to be stored.

Optionally, the updating the state of the data to be stored according to the length information of the data to be stored includes:

when the length information is smaller than a third preset threshold, determining the state of the data to be stored as the hot data state; otherwise, determining the state of the data to be stored as the cold data state.

Optionally, the method further includes:

determining a state of a key's value of the data to be stored, where the state of the key's value of the data to be stored is a cold data state or a hot data state; and determining a storage medium for the key's value of the data to be stored according to the state of the key's value of the data to be stored, and storing the key's value of the data to be stored in the storage medium determined for the key's value of the data to be stored.

Optionally, the storing the data to be stored in the storage medium includes:

compressing the data to be stored, and storing the compressed data to be stored in the storage medium.

Optionally, the storing the data to be stored in the storage medium includes:

sorting the data to be stored according to a value of the data to be stored, and storing the sorted data to be stored in the storage medium.

Optionally, the determining the corresponding storage medium for the data to be stored according to the state of the data to be stored includes:

when the state of the data to be stored is the hot data state, determining a memory as the corresponding storage medium for the data to be stored; and when the state of the data to be stored is the cold data state, determining a disk as the corresponding storage medium for the data to be stored.

Optionally, the method further includes:

determining a data storage ratio between a memory and a disk according to at least one of: a memory occupation, a ratio of between data stored in the memory and data stored in the disk; and determining the first preset threshold and the second preset threshold according to the data storage ratio.

In a second aspect, an embodiment of the present disclosure provides a data storage apparatus, including:

a receiving module, configured to receive a data storage request from a client, where the data storage request includes data to be stored;

a determining module, configured to determine a state of the data to be stored according to a least frequently used (LFU) and a least recently used (LRU) of the data to be stored, where the state is a cold data state or a hot data state;

the determining module is further configured to determine a corresponding storage medium for the data to be stored according to the state of the data to be stored; and a storing module, configured to store the data to be stored in the corresponding storage medium determined for the data to be stored.

Optionally, the determining module is specifically configured to:

when the LFU of the data to be stored is greater than a first preset threshold and the LRU is greater than a second preset threshold, determine the state of the data to be stored as the hot data state; otherwise, determine the state of the data to be stored as the cold data state.

Optionally, the apparatus further includes:

an updating module, configured to update the state of the data to be stored according to length information of the data to be stored.

Optionally, the updating module is specifically configured to:

when the length information is smaller than a third preset threshold, determine the state of the data to be stored as the hot data state; otherwise, determine the state of the data to be stored as the cold data state.

Optionally, the determining module is further configured to determine a state of a key's value of the data to be stored, where the state of the key's value of the data to be stored is a cold data state or a hot data state; and the determining module is further configured to determine a corresponding storage medium for the key's value of the data to be stored according to the state of the key's value of the data to be stored; and the storing module is further configured to store the key's value of the data to be stored in the storage medium determined for the key's value of the data to be stored.

Optionally, the storing module is specifically configured to:

compress the data to be stored, and store the compressed data to be stored in the storage medium.

Optionally, the storing module is specifically configured to:

sort the data to be stored according to a value of the data to be stored, and store the sorted data to be stored in the storage medium.

Optionally, the determining module is specifically configured to:

when the state of the data to be stored is the hot data state, determine a memory as the corresponding storage medium for the data to be stored; and when the state of the data to be stored is the cold data state, determine a disk as the corresponding storage medium for the data to be stored.

Optionally, the determining module is further configured to determine a data storage ratio between the memory and the disk according to at least one of: a memory occupation, a ratio between data stored in the memory and data stored in the disk; and the determining module is further configured to determine the first preset threshold and the second preset threshold according to the data storage ratio.

In a third aspect, an embodiment of the present disclosure provides a server, including:

a processor;

a storage device; and a computer program, where the computer program is stored in the storage device and is configured to be executed by the processor, the computer program including instructions for executing the method according to the first aspect.

In a fourth aspect, an embodiment of the present disclosure provides a computer readable storage medium storing a computer program which causes a server to execute the method according to the first aspect.

According to the data storage method, the apparatus and the storage medium provided in the present disclosure, a data storage request is received from a client, where the data storage request includes data to be stored; a state of the data to be stored is determined according to a least frequently used (LFU) and a least recently used (LRU) of the data to be stored, where the state is a cold data state or a hot data state; and corresponding storage medium is determined for the data to be stored according to the state of the data to be stored, and the data to be stored is stored in the storage medium. Since the state of the data to be stored is determined according to its LFU and LRU, the accuracy can be improved for determining the state of the data. Thus, the probability of the system to read the disk is reduced, and the stability of the system can be improved.

BRIEF DESCRIPTION OF THE DRAWINGS

In order to more clearly illustrate the embodiments of the present disclosure or the technical solutions in the prior art, the drawings required in describing the embodiments or the prior art will be briefly introduced below. Apparently, the drawings described in the following are only for some embodiments of the present disclosure, and other drawings can be obtained by those skilled in the art without paying any creative efforts.

DETAILED DESCRIPTION OF THE EMBODIMENTS

Now, the technical solutions in the embodiments of the present disclosure will be described hereunder clearly and comprehensively with reference to accompanying drawings. Obviously, the described embodiments are only a part of embodiments of the present disclosure, rather than all of them. Any and all other embodiments derived by a person skilled in the art based on the embodiments of the present disclosure without making any creative effort shall fall within the scope of the present disclosure.

The terms "first", "second", "third" and "fourth", etc. (if present) in the specification and claims of the present disclosure and the aforementioned drawings are used to distinguish similar objects without any intend to describe any specific sequence or order. It is to be understood that the number used as such may be interchanged as appropriate, as long as the embodiments of the invention described herein can be implemented in a sequence other than those illustrated or described herein. In addition, the terms "include" and "comprise" and their variations in any form are intended to cover a non-exclusive inclusion. For example, a process, method, system, product or device that "includes" a series of steps or units is not necessarily limited to those steps or units explicitly listed. Rather, they may include other steps or units not explicitly listed or inherent to such process, method, system, product or device.

Figure 1:
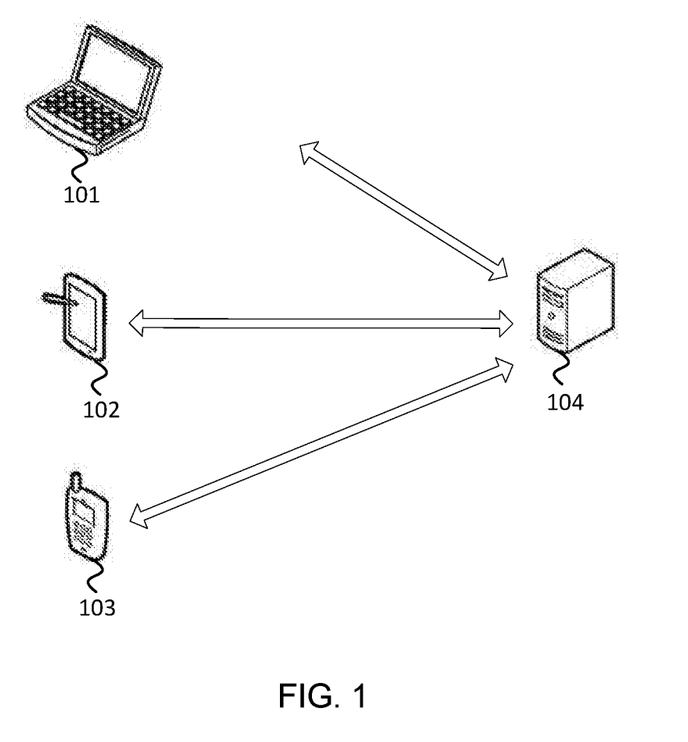
FIG. 1 is a schematic architectural diagram applying a data storage method according to an embodiment of the present disclosure.

FIG. 1 is a schematic architectural diagram applying a data storage method according to an embodiment of the present disclosure. As shown in FIG. 1, the system architecture may include a client 101, 102 or 103 and a server 104.

The client 101, 102 or 103 may be various electronic devices supporting information communication, including, but not limited to, a smart phone, a tablet, a portable computer, a desktop computer, and the like. The client 101, 102 or 103 can access data by using the Redis protocol, and is compatible with all Redis application programming interfaces (APIs).

The server 104 may complete storage of the data to be stored, such as storage of key and value. When the server 104 receives a data storage request from the client 101, 102 or 103 in a scenario of writing data, the present application supports firstly writing to a memory, and then storing the data to the corresponding storage medium according to a least frequency used (LFU) and a least recently used (LRU). Further, the data may also be stored into the corresponding storage medium according to the LFU, the LRU, and the data length simultaneously. In addition, an embodiment may also support directly writing the data to the storage medium. In a scenario of reading data, the data may be read directly from a memory or a disk according to a memory index tag.

It is to be understood that the data storage method provided in the embodiment of the present disclosure may be performed by the server 104 shown in FIG. 1.

In addition, it should be noted that a number of and a type of the client, the network and the server shown in FIG. 1 are only shown as illustrations. In actual applications, the number of and/or the type of the client, the network and the server may be involved, as practically needed.

Figure 2:
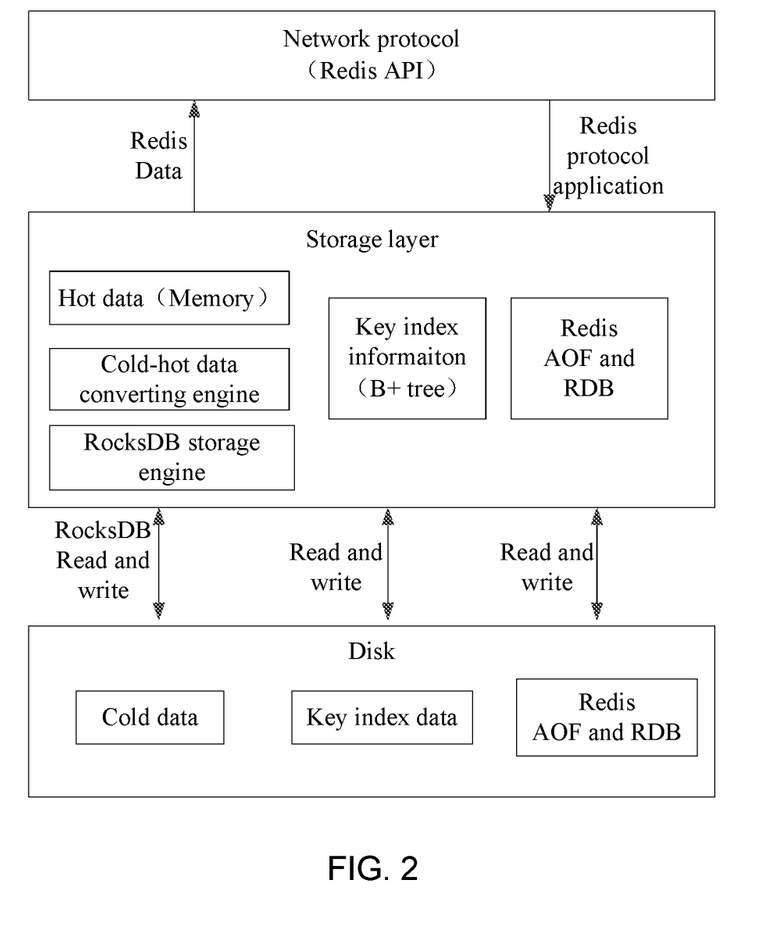
FIG. 2 is a schematic system architectural diagram of a data storage method according to an embodiment of the present disclosure.

FIG. 2 is a schematic system architectural diagram of a data storage method according to an embodiment of the present disclosure. As shown in FIG. 2, a client accesses a server via a network protocol Redis application programming interface (API). A service layer in the server stores a data to be stored in the hot data state, into a memory, and a RockDB storage engine stores a data to be stored in the cold data state, into a disk. In addition, a cold-hot data converting engine transfers the data, which has been converted from the hot data state to the cold data state, from the memory into the disk, and transfers the data, which has been converted from the cold data state to the hot data state, from the disk into the memory.

Further, the key index information in the memory is organized as a B+ tree. The key index information in the cold data state may be stored into the disk, and the key index information, whose length information is greater than a preset value, may also be stored into the disk, thereby conserving storage space in the memory.

In addition, for the data persistence designs (AOF and RDB) compatible with the existing Redis, the master-slave synchronization relies on an RDB+ incremental operation. Since the master-slave replication is close to the native Redis in efficiency, it improves the efficiency of the master-slave replication.

For an upgraded Redis snapshotting scheme, an embodiment of the present disclosure replaces the serialism with parallelism to improve the efficiency of the master-slave replication. In addition, the Redis service may be upgraded by using substitutive binary way in order to significantly reduce the upgrade cost of the Redis service while maintain compatibility with existing Redis service operation and maintenance solution and monitoring solution.

On the basis of the schematic architectural diagrams shown in FIGS. 1 and 2, the data storage method provided by the embodiment of the present disclosure may be applied to a scenario in which a key and a value are stored. In the prior art, when data is stored by combining a memory with a disk, a popularity statistics algorithm based on the least frequently used (LFU) of the key is typically used to identify a state of the value as hot data state, where the hot data will be stored in the memory, while cold data, i.e., data with no or infrequent access, will be stored in the hard disk. In this way, the criteria to assess the data state is relatively superficial, leading to inaccuracy in deciding the cold data state and the hot data state, which in turn cause the probability of the system to read the disk increased, resulting in poor system stability.

In consideration of the above problem, embodiments of the present disclosure propose a data storage method in which a data storage request is received from a client, where the data storage request includes data to be stored; a state of the data to be stored is determined according to a least frequently used (LFU) and a least recently used (LRU) of the data to be stored, where the state is a cold data state or a hot data state; and a corresponding storage medium is determined for the data to be stored according to the state of the data to be stored, and the data to be stored is stored in the storage medium determined. Since the state of the data to be stored is determined according to its LFU and LRU, the accuracy can be improved for determining the state of the data. Thus, the probability of the system to read the disk is reduced, and the stability of the system can be improved.

Now, the technical solution of the present disclosure will be detailed with reference to specific embodiments. The following specific embodiments may be combined with each other, and the same or similar concepts or processes may not be repeated in some embodiments.

Figure 3:
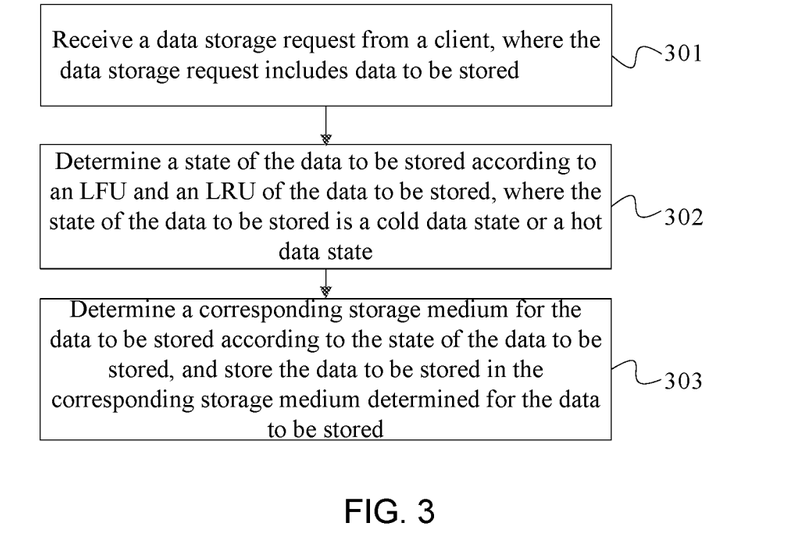
FIG. 3 is a flowchart of a first data storage method embodiment according to an embodiment of the present disclosure.

On the basis of the schematic architectural diagrams shown in FIGS. 1 and 2, FIG. 3 illustrates a flowchart of a first data storage method embodiment according to an embodiment of the present disclosure. An embodiment of the present disclosure provides a data storage method, which may be performed by any apparatus configured to perform the data storage method, and the apparatus may be implemented by software and/or hardware. In this embodiment, the apparatus may be integrated into a server. As shown in FIG. 3, the method in this embodiment may include:

Step 301: receive a data storage request from a client, where the data storage request includes data to be stored.

In this embodiment, a Redis client may access data by using a Redis protocol, that is, sending a data storage request to a server via the Redis protocol. Since the client accesses data by using the Redis protocol, it is compatible with all Redis APIs.

When the client has data to be stored, a data storage request, which includes the data to be stored, may be sent to the server. In a possible implementation, the data to be stored includes a key and a value.

In addition, when the client uses the Redis API to send the data access request to the server, the server will receive and process the data access request, and return the data in compliance with the Redis protocol after the intended data has been found.

Step 302: determine a state of the data to be stored according to an LFU and an LRU of the data to be stored, where the state of the data to be stored is a cold data state or a hot data state.

In this embodiment, after receiving the data to be stored from the client, the server will determine the LFU and the LRU of the data to be stored in order to determine the state of the data to be stored, i.e., determine whether the data to be stored is in the hot data state or the cold data state. The hot data state indicates that the data to be stored is frequently used and accessed by the system, and the cold data state indicates that the data to be stored is infrequently used and accessed by the system.

In a possible implementation, the determining the state of the data to be stored according to the LFU and the LRU of the data to be stored may be accomplished by: when the LFU of the data to be stored is greater than a first preset threshold and the LRU is greater than a second preset threshold, determining the state of the data to be stored as the hot data state; otherwise, determining the state of the data to be stored as the cold data state.

Specifically, the LFU is used to indicate the frequency of access to the data to be stored during a time period, and the LRU is used to indicate the number of accesses to the data to be stored during the time period. When the server determines that the LFU of the data to be stored is greater than the first preset threshold and the LRU is greater than the second preset threshold, it indicates a relatively higher frequency of access and a relatively higher number of access to the data to be stored during the time period. Thus, it may be determined that the state of the data to be stored is the hot data state.

When the server determines that the LFU of the data to be stored is not greater than the first preset threshold and the LRU is not greater than the second preset threshold, it indicates a relatively lower frequency of access and a relatively lower lower number of access to the data to be stored during the time period. Thus, it may be determined that the state of the data to be stored is the cold data state.

Since the state of the data to be stored is determined as the hot data state or the cold data state according to whether the LFU of the data to be stored is greater than the first preset threshold and whether the LRU is greater than the second preset threshold, and the state of the data is determined in the present disclosure according to the LFU value and the LRU value of the data during a sampling period, compared with the prior art where the state of the data is only determined according to a global LFU, a smoothing operation may dodge the problem of jitter in the performance. Moreover, since the LRU is also considered, not only the data warm-up is faster, but also the accuracy can be improved for determining the data state.

In addition, the first preset threshold and the second preset threshold may be set according to experience or the actual condition, and their specific values will not be limited in the embodiment of the present disclosure.

Optionally, for the purpose of enabling real time adjustment of the proportion of data stored in the memory and the disk during operation of a specific implementation, a data storage ratio between the memory and the disk may be determined according to at least one of: a memory occupation, a ratio between the data stored in the memory and the data stored in the disk, and the first preset threshold and the second preset threshold may be determined according to the data storage ratio.

Specifically, the server may determine the data storage ratio between the memory and the disk according to at least one of: a memory occupation, a ratio between the data stored in the memory and the data stored in the disk, and then adjust the specific values for the first preset threshold and the second preset threshold. For example, when the memory occupation exceeds a preset value, the server will make adjustment to store a larger proportion of the data to the disk and a less proportion to the memory. At this time, the server may raise the specific values for the first preset threshold and the second preset threshold. For another example, when the data storage ration between the memory and the disk is excessive, i.e., more data is stored in the memory while less is stored in the disk, the server may raise the specific values for the first preset threshold and the second preset threshold, so that most of the subsequent data to be stored is stored into the disk.

Since the specific values for the first preset threshold and the second preset threshold may be adjusted in real-time according to at least one of the memory occupation and the ratio between the data stored in the memory and the data stored in the disk, the capacity ratio between the memory and the disk may thus be flexibly configured.

Further, following the determining the state of the data to be stored according to the LFU and the LRU of the data to be stored, the server may further update the state of the data to be stored according to length information of the data to be stored.

Specifically, when the length information is smaller than a third preset threshold, the state of the data to be stored will be determined as the hot data state; otherwise, the state of the data to be stored will be determined as the cold data state.

When determining the state of the data to be stored, the server needs to consider the length information of the data to be stored in addition to the LFU and the LRU. For example, the state of the data to be stored is determined to be the hot data state when the LFU of the data to be stored is greater than the first preset threshold, the LRU is greater than the second preset threshold, and the length information of the data to be stored is smaller than the third preset threshold. Otherwise, the state of the data to be stored may be determined to be the cold data state.

Since the LFU, LRU and length information of the data to be stored are jointly considered when determining the state of the data to be stored, it is possible to avoid determining the data to be stored which is long as hot data and store it in the memory, thereby saving memory storage space.

Step 303: determine a corresponding storage medium for the data to be stored according to the state of the data to be stored, and store the data to be stored in the corresponding storage medium determined for the data to be stored.

In this embodiment, after determining the state of the data to be stored, the server may determine the corresponding storage medium accordingly.

In a possible implementation, when the state of the data to be stored is the hot data state, the memory is determined as the corresponding storage medium for the data to be stored. Otherwise, when the state of the data to be stored is the cold data state, the disk is determined as the corresponding storage medium for the data to be stored.

Specifically, when the data to be stored is in the hot data state, it has relatively high frequency of access and number of access, and may be stored in the memory, so that the data may be read directly from the memory when the server accesses the data.

When the data to be stored is in the cold data state, it has relatively low frequency of access and number of access, and may be stored in the disk, so that the data may be read directly from the disk when the server accesses the data.

Since the data to be stored in the hot data state is stored in the memory and the data to be stored in the cold data state is stored in the disk, the system may be prevented from frequently accessing the disk, thereby providing large capacity throughput while providing data access with high throughput and low latency.

Further, after the data to be stored has been stored in its corresponding storage medium for a preset duration, the server will determine whether the state of the data to be stored has changed, e.g., whether the state of the data to be stored has changed from the hot data state to the cold data state, or vice versa. If it is determined that the state of the data to be stored has changed, the server will need to re-determine the storage medium.

For example, when the data to be stored has changed from the hot data state to the cold data state, the server will transfer the data to be stored from the memory to the disk. Otherwise, when the data to be stored has changed from the cold data state to the hot data state, the server will transfer the data to be stored from the disk to the memory.

Further, when an cold-hot data converting engine in the server transfers the data to be stored in the cold data state from the memory to the disk, the particular type of storage medium, e.g., Serial Advanced Technology Attachment (SATA), Solid State Drives (SSD) or Non-Volatile Memory Express (NVME), for keeping the data to be stored may be determined according to the data characteristics, such as the number of access to the data and/or the length of the data. Since the selection may be made among a plurality of disk storage media, different data may be stored accordingly, thereby improving the cost effectiveness of the system.

In addition, in the prior art, the technique of combining the memory with the disk is typically applied to storing the values only, leaving the keys all in the memory. Hence, when the number of keys is large or the lengths of the keys are long, memory occupation becomes high.

In order to solve this problem, in an embodiment of the present disclosure, a state of a key's value may also be determined according to the LRU and the LFU, that is, determining the state of the key as the cold data state or as the hot data state, and according to the state of the key's value of the data to be stored, the storage medium for the key's value of the data to be stored may be determined, and the key's value of the data to be stored may be stored into the storage medium determined.

Specifically, the keys in the memory are organized into a B+ tree, and each key is divided into multiple segments according to rules of the segmented HASH, and a HASH value of each segment is used as the node value of each layer of the B+ tree, with the B+ tree leaf node being the description corresponding to the value. The cold-hot data converting engine in the server stores the key in the cold data state into the disk, i.e., index information that is infrequently accessed is flushed to the disk in page. In addition, memory HASH may also be selected as the mode for organizing the keys, that is, information of all the keys may be placed in the memory.

In addition, in a scenario where length information of the key is greater than a preset value, the B+ tree may be selected for organizing the key indexes, that is, longer keys are stored into the disk to save the space in the memory occupied by the keys.

It should be noted that the key index maintenance in this embodiment may support diversity of secondary index to facilitate high-performance global data/local data scanning operation (such as hgetall, lrange, etc.) and data sorting operation (such as zrange, zscore, etc.).

Further, following determining the storage medium corresponding to the data to be stored, the server may store the data to be stored in the storage medium. In a possible implementation, when storing the data to be stored, the server may compress the data to be stored, and then store the compressed data to be stored in the storage medium.

Specifically, the server may firstly compress the data to be stored before storing the same. For example, the key and the value may both be compressed and then stored in the storage medium. This improves the storage density of the data to be stored in the storage medium, reduces the amount stored in the disk, reduces the performance implication caused by the read amplification, ensuring the stability of the performance.

In another possible implementation, when storing the data to be stored the server may also aggregate and sort the data to be stored according to the key/value of the data to be stored, and then store the aggregated and sorted data to be stored in the storage medium.

Specifically, when storing the data to be stored, the server may firstly aggregate and sort the data to be stored according to the key/value of the data to be stored, e.g., aggregate and sort the key and the value, and then store the aggregated and sorted key and value in the storage medium. This can reduce the number of times that the system accesses the disk, minimize the problem of read amplification for the disk, and improve the stability of the system.

It should be noted that the server can support two modes when storing the data: synchronous disk storage and asynchronous disk storage, where the synchronous disk storage writes the data directly to the disk and records the index of its key, and the asynchronous disk storage writes the data firstly to the memory and then asynchronously transfer the data to the disk in the background.

In addition, after storing the data to be stored in the storage medium, the server establishes a mapping relationship between the data saved in the memory and the data saved in the disk, and saves the mapping relationship into index information corresponding to the key. When a client accesses a key whose corresponding value is stored in the disk, the saved mapping relationship is firstly read based on the key, and then the actual data is read from the disk.

According to the data storage method provided in the embodiment of the present disclosure, a data storage request is received from a client, where the data storage request includes data to be stored; a state of the data to be stored is determined according to a least frequently used (LFU) and a least recently used (LRU) of the data to be stored, where the state is a cold data state or a hot data state; and a corresponding storage medium is determined for the data to be stored according to the state of the data to be stored, and the data to be stored is stored in the storage medium. Since the state of the data to be stored is determined according to its LFU and LRU, the accuracy can be improved for determining the state of the data. Thus, the probability of the system to read the disk is reduced, and the stability of the system can be improved.

Figure 4:
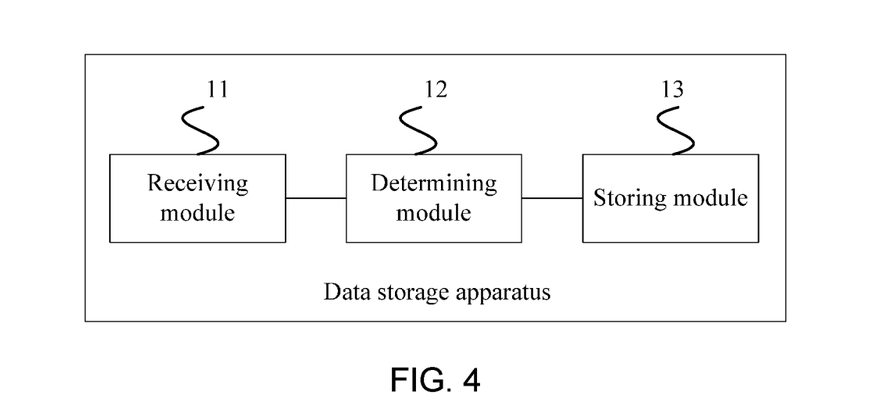
FIG. 4 is a schematic structural diagram of a first data storage apparatus embodiment according to an embodiment of the present disclosure.

FIG. 4 is a schematic structural diagram of a first data storage apparatus embodiment according to an embodiment of the present disclosure. The data storage apparatus may be a stand-alone server or an apparatus integrated in a server, and the apparatus may be implemented by software, hardware or a combination thereof. As shown in FIG. 4, the apparatus includes:

a receiving module 11, configured to receive a data storage request from a client, where the data storage request includes data to be stored;

a determining module 12, configured to determine a state of the data to be stored according to a least frequently used (LFU) and a least recently used (LRU) of the data to be stored, where the state is a cold data state or a hot data state;

the determining module 12 is further configured to determine a corresponding storage medium for the data to be stored according to the state of the data to be stored; and a storing module 13, configured to store the data to be stored in the storage medium.

According to the data storage apparatus provided in the embodiment of the present disclosure, the receiving module 11 receives a data storage request from a client, where the data storage request includes data to be stored; the determining module 12 determines a state of the data to be stored according to a least frequently used (LFU) and a least recently used (LRU) of the data to be stored, where the state is a cold data state or a hot data state; and then the determining module 12 determines a corresponding storage medium for the data to be stored according to the state of the data to be stored; and the storing module 13 stores the data to be stored in the storage medium. Since the state of the data to be stored is determined according to its LFU and LRU, the accuracy can be improved for determining the state of the data. Thus, the probability of the system to read the disk is reduced, and the stability of the system can be improved.

Optionally, the determining module 12 is specifically configured to:

when the LFU of the data to be stored is greater than a first preset threshold and the LRU is greater than a second preset threshold, determine the state of the data to be stored as the hot data state; otherwise, determine the state of the data to be stored as the cold data state.

Figure 5:
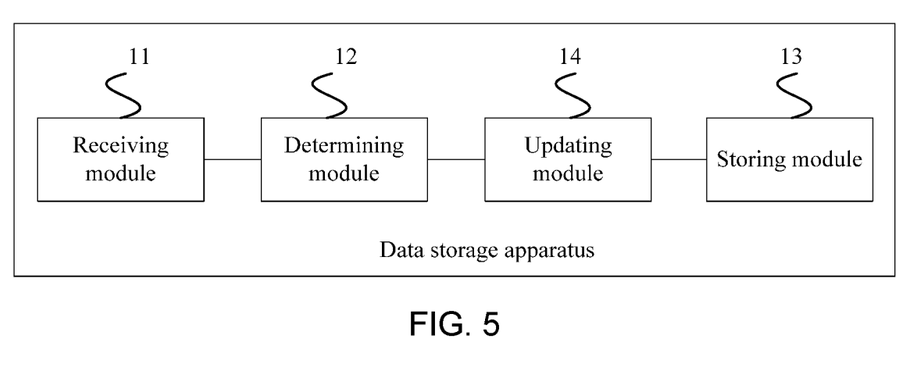
FIG. 5 is a schematic structural diagram of a second data storage apparatus embodiment according to an embodiment of the present disclosure.

FIG. 5 is a schematic structural diagram of a second data storage apparatus embodiment according to an embodiment of the present disclosure. On the basis of the apparatus shown in FIG. 4, the apparatus further includes an updating module 14.

The updating module 14 is configured to update the state of the data to be stored according to length information of the data to be stored.

Optionally, the updating module 14 is specifically configured to:

when the length information is smaller than a third preset threshold, determine the state of the data to be stored as the hot data state; otherwise, determine the state of the data to be stored as the cold data state.

Optionally, the determining module 12 is further configured to determine a state of a key's value of the data to be stored, where the state is the cold data state or the hot data state; and the determining module 12 is further configured to determine a corresponding storage medium for the key's value of the data to be stored according to the state of the key's value of the data to be stored.

The storing module 13 is further configured to store the key's value of the data to be stored in the storage medium.

Optionally, the storing module 13 is specifically configured to:

compress the data to be stored, and store the compressed data to be stored in the storage medium.

Optionally, the storing module 13 is specifically configured to:

sort the data to be stored according to a value of the data to be stored, and store the sorted data to be stored in the storage medium.

Optionally, the determining module 12 is specifically configured to:

when the state of the data to be stored is the hot data state, determine a memory as the corresponding storage medium for the data to be stored; and when the state of the data to be stored is the cold data state, determine a disk as the corresponding storage medium for the data to be stored.

Optionally, the determining module 12 is further configured to determine a data storage ratio between the memory and the disk according to at least one of: a memory occupation, a ratio between the data stored in the memory and the data stored in the disk; and the determining module 12 is further configured to determine the first preset threshold and the second preset threshold according to the data storage ratio.

The data storage apparatus provided by the embodiment of the present disclosure may perform the foregoing corresponding method embodiment following similar implementation principles and producing similar technical effects, which will not be repeated herein.

Figure 6A:
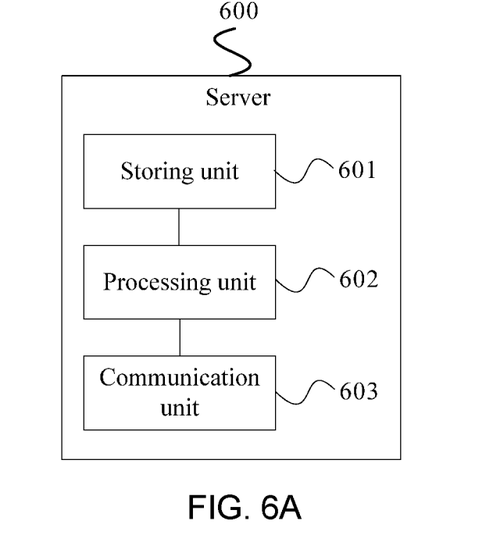
FIG. 6A is a possible schematic structural diagram depicting a server according to the present disclosure.

FIG. 6A is a possible schematic structural diagram depicting a server according to the present disclosure. The server 600 includes a processing unit 602 and a communication unit 603. The processing unit 602 is configured to control and manage the actions of the server 600. For example, the processing unit 602 may be configured to support the server 600 to perform Steps 302 and 303 of FIG. 3, and/or other processes for the techniques described herein. The communication unit 603 is configured to support communication of the server 600 with other network entities, such as with the client shown in FIG. 1. The server 600 may also include a storing unit 601 configured to store computer program codes and data for the server 600.

The processing unit 602 may be a processor or a controller, such as a CPU, a general-purpose processor, a digital signal processor (DSP), an application-specific integrated circuit (ASIC), a field programmable gate array (FPGA) or other programmable logic device, transistor logic device, hardware component or any combination thereof. The processing unit 602 may implement or execute the various illustrative logical blocks, modules and circuits described in connection with disclosure of the present disclosure. The processor may also be implemented as a combination of computing functions, such as a combination of one or more microprocessors, a combination of a DSP and a microprocessor, and the like. The communication unit 603 may be a communication interface, a transceiver, a transceiver circuit, etc., where the communication interface is a collective term that may include one or more interfaces. The storing unit 601 may be a storage device.

Figure 6B:
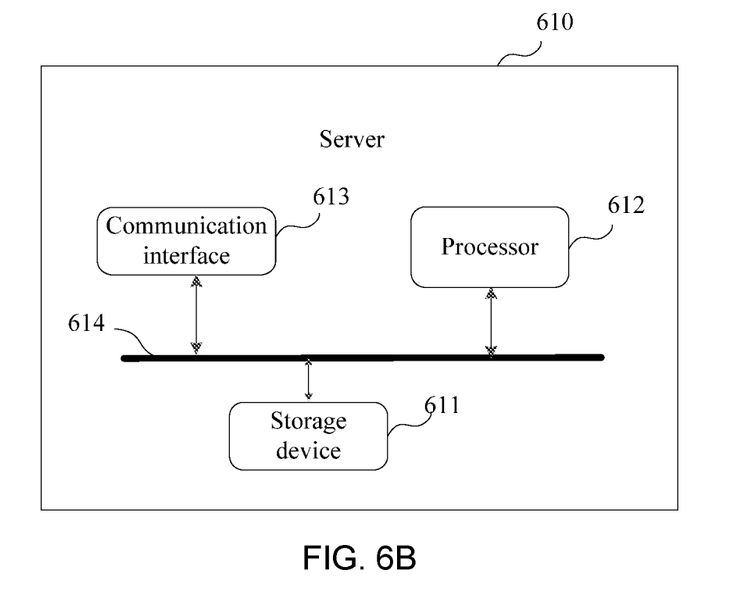
FIG. 6B is another possible schematic structural diagram depicting a server according to the present disclosure.

When the processing unit 602 is a processor, the communication unit 603 is a communication interface and the storing unit 601 is a storage device, the server involved in the present disclosure may be the server shown in FIG. 6B.

Referring to FIG. 6B, the server 610 includes a processor 612, a communication interface 613, and a storage device 611. Optionally, the server 610 may also include a bus 614. The communication interface 613, the processor 612, and the storage device 611 may be inter-connected via the bus 614, which may be a peripheral component interconnect (PCI) bus or an extended industry standard architecture (EISA) bus. The bus 614 may be divided into an address bus, a data bus, a control bus, and the like. For ease of representation, only one thick line is shown in FIG. 6B, but it does not mean that there is only one bus or one type of bus.

Additionally, a computer program is stored in storage device 611 and is configured to be executed by the processor 612. The computer program includes instructions for executing the method described in the embodiment of FIG. 3.

An embodiment of the present disclosure further provides a computer readable storage medium storing a computer program which causes a server to execute the data storage method provided by the aforementioned embodiment shown in FIG. 3. The aforementioned readable storage medium may be implemented by any type of volatile or non-volatile storage device or a combination thereof, such as static random access memory (SRAM), electrically erasable programmable read only memory (EEPROM), erasable programmable read only memory (EPROM), programmable read only memory (PROM), read only memory (ROM), magnetic memory, flash memory, magnetic disk or optical disk.

It will be understood by those skilled in the art that all or part of the steps of the foregoing method embodiments may be implemented by a hardware in relation to program instructions. The aforementioned program may be stored in a computer readable storage medium. The program, when executed, executes steps incorporating the foregoing method embodiments, and the foregoing storage medium includes various media that can store program codes, such as a ROM, a RAM, a magnetic disk, or an optical disk.

Finally, it should be noted that the foregoing embodiments are merely intended for describing, rather than limiting, the technical solutions of the present disclosure. Although the present disclosure is described in detail with reference to the foregoing embodiments, persons of ordinary skill in the art should understand that they may still make modifications to the technical solutions described in the foregoing embodiments, or make equivalent replacements to some or all technical features therein; however, these modifications or replacements do not make the essence of corresponding technical solutions depart from the scope of the technical solutions in the embodiments of the present disclosure.

What is claimed is:

1. A data storage method, comprising:
    receiving a data storage request from a client, wherein the data storage request comprises data to be stored;
    determining a state of the data to be stored to be a hot data state when a least frequently used (LFU) of the data to be stored is greater than a first preset threshold, a least recently used (LRU) of the data to be stored is greater than a second preset threshold, and length information of the data to be stored is smaller than a third preset threshold; otherwise, determining the state of the data to be stored to be a cold data state;
    determining a corresponding storage medium for the data to be stored according to the state of the data to be stored, and storing the data to be stored in the corresponding storage medium determined for the data to be stored;
    wherein the data to be stored comprises a key and a value, and the storing the data to be stored in the storage medium comprises:
    sorting the data to be stored according to the value of the data to be stored, and storing the sorted data to be stored in the storage medium.

2. The method according to claim 1, further comprising:
    determining a state of a key's value of the data to be stored, wherein the state of the key's value of the data to be stored is a cold data state or a hot data state; and
    determining a storage medium for the key's value of the data to be stored according to the state of the key's value of the data to be stored, and storing the key's value of the data to be stored in the storage medium determined for the key's value of the data to be stored.

3. The method according to claim 1, wherein the storing the data to be stored in the storage medium comprises:
    compressing the data to be stored, and storing the compressed data to be stored in the storage medium.

4. The method according to claim 1, wherein the determining the corresponding storage medium for the data to be stored according to the state of the data to be stored comprises:
    when the state of the data to be stored is the hot data state, determining a memory as the corresponding storage medium for the data to be stored; and
    when the state of the data to be stored is the cold data state, determining a disk as the corresponding storage medium for the data to be stored.

5. The method according to claim 1, further comprising:
    determining a data storage ratio between a memory and a disk according to at least one of: a memory occupation, a ratio between data stored in the memory and data stored in the disk; and
    determining the first preset threshold and the second preset threshold according to the data storage ratio.

6. A data storage apparatus, comprising a processor, a storage device, and a computer program, wherein the computer program is stored in the storage device and is configured to be executed by the processor, the computer program comprising instructions for executing the method comprising:
    receiving a data storage request from a client, wherein the data storage request comprises data to be stored;
    determining a state of the data to be stored to be a hot data state when a least frequently used (LFU) of the data to be stored is greater than a first preset threshold, a least recently used (LRU) of the data to be stored is greater than a second preset threshold, and length information of the data to be stored is smaller than a third preset threshold; otherwise, determining the state of the data to be stored to be a cold data state;
    determining a corresponding storage medium for the data to be stored according to the state of the data to be stored; and
    storing the data to be stored in the corresponding storage medium determined for the data to be stored;
    wherein the data to be stored comprises a key and a value, and the computer program comprises instructions for executing the method comprising:
    sorting the data to be stored according to the value of the data to be stored, and storing the sorted data to be stored in the storage medium.

7. The apparatus according to claim 6, wherein the computer program comprises instructions for executing the method further comprising:
    determining a state of a key's value of the data to be stored, wherein the state of the key's value of the data to be stored is a cold data state or a hot data state; and
    determining a storage medium for the key's value of the data to be stored according to the state of the key's value of the data to be stored; and
    storing the key's value of the data to be stored in the storage medium determined for the key's value of the data to be stored.

8. The apparatus according to claim 6, wherein the computer program comprises instructions for executing the method comprising:
    compressing the data to be stored, and storing the compressed data to be stored in the storage medium.

9. The apparatus according to claim 6, wherein the computer program comprises instructions for executing the method comprising:
    when the state of the data to be stored is the hot data state, determining a memory as the corresponding storage medium for the data to be stored; and
    when the state of the data to be stored is the cold data state, determining a disk as the corresponding storage medium for the data to be stored.

10. The apparatus according to claim 6, wherein the computer program comprises instructions for executing the method comprising:
   determining a data storage ratio between a memory and a disk according to at least one of: a memory occupation, a ratio between data stored in the memory and data stored in the disk; and
   determining the first preset threshold and the second preset threshold according to the data storage ratio.

11. A non-transitory computer readable storage medium storing a computer program which causes a server to execute the method according to claim 1.

* * * * *